(12) United States Patent
Tischler et al.

(10) Patent No.: US 8,449,125 B2
(45) Date of Patent: *May 28, 2013

(54) LIGHT-ABSORBING STRUCTURE AND METHODS OF MAKING

(75) Inventors: Jonathan R. Tischler, Sharon, MA (US); Michael Scott Bradley, Quincy, MA (US); Vladimir Bulovic, Lexington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 926 days.

This patent is subject to a terminal disclaimer.

(21) Appl. No.: 12/162,892

(22) PCT Filed: Feb. 14, 2007

(86) PCT No.: PCT/US2007/003676
§ 371 (c)(1),
(2), (4) Date: Feb. 5, 2009

(87) PCT Pub. No.: WO2007/095172
PCT Pub. Date: Aug. 23, 2007

(65) Prior Publication Data
US 2009/0219622 A1 Sep. 3, 2009

Related U.S. Application Data

(60) Provisional application No. 60/772,882, filed on Feb. 14, 2006.

(51) Int. Cl.
*G02B 27/00* (2006.01)

(52) U.S. Cl.
USPC .......................................... 359/614; 359/601

(58) Field of Classification Search
USPC ...................................... 359/601–614
See application file for complete search history.

(56) References Cited

U.S. PATENT DOCUMENTS

| | | | |
|---|---|---|---|
| 3,837,682 A * | 9/1974 | Feller | 462/17 |
| 5,110,648 A * | 5/1992 | Suzuki et al. | 428/64.8 |
| 5,555,114 A | 9/1996 | Narita et al. | |
| 6,076,932 A | 6/2000 | Uchida et al. | |
| 6,510,005 B1 * | 1/2003 | Goldstein | 359/614 |
| 6,610,457 B2 | 8/2003 | Kim et al. | |
| 6,676,859 B2 | 1/2004 | Hartley et al. | |
| 6,949,332 B2 * | 9/2005 | Kawakami et al. | 430/449 |
| 7,112,361 B2 | 9/2006 | Lynn et al. | |
| 7,799,422 B2 * | 9/2010 | Tischler et al. | 428/338 |
| 2003/0124368 A1 | 7/2003 | Lynn et al. | |
| 2005/0205903 A1 | 9/2005 | Hioki | |
| 2005/0280898 A1 * | 12/2005 | Oshima et al. | 359/614 |

* cited by examiner

*Primary Examiner* — Thong Nguyen
(74) *Attorney, Agent, or Firm* — Steptoe & Johnson LLP

(57) ABSTRACT

A critically coupled optical resonator absorbs greater than 95% of incident light of the critical wavelength with an absorber layer less than 10 nm thick.

49 Claims, 5 Drawing Sheets

LIGHT-ABSORBING STRUCTURE AND METHODS OF MAKING

CLAIM OF PRIORITY

This application claims priority under 35 USC 371 to International Application No. PCT/US2007/003676, filed on Feb. 14, 2007, which claims priority to U.S. Provisional Application Ser. No. 60/772,882, filed on Feb. 14, 2006, each of which is incorporated by reference in its entirety.

FEDERALLY SPONSORED RESEARCH OR DEVELOPMENT

This invention was made with government support under Grant Number MDA972-00-1-0023, awarded by DARPA. The government has certain rights in the invention.

TECHNICAL FIELD

This invention relates to light-absorbing structures and methods of making the structures.

BACKGROUND

Light-emitting devices can be used, for example, in displays (e.g., flat-panel displays), screens (e.g., computer screens), and other items that require illumination. Accordingly, the brightness of the light-emitting device is one important feature of the device. Also, low operating voltages and high efficiencies can improve the viability of producing emissive devices.

Light-emitting devices can release photons in response to excitation of an active component of the device. Emission can be stimulated by applying a voltage across the active component (e.g., an electroluminescent component) of the device. The electroluminescent component can be a polymer, such as a conjugated organic polymer or a polymer containing electroluminescent moieties or layers of organic molecules. Typically, the emission can occur by radiative recombination of an excited charge between layers of a device. The emitted light has an emission profile that includes a maximum emission wavelength, and an emission intensity, measured in luminance (candelas/square meter ($cd/m^2$) or power flux ($W/m^2$)). The emission profile, and other physical characteristics of the device, can be altered by the electronic structure (e.g., energy gaps) of the material. For example, the brightness, range of color, efficiency, operating voltage, and operating half-lives of light-emitting devices can vary based on the structure of the device.

SUMMARY

A high oscillator strength thin film can be applied to a surface. The film can have an absorption coefficient greater than $10^5$ $cm^{-1}$, for example, $10^6$ $cm^{-1}$ or larger. The films can be formed by adsorption into layered structures of charged species with strong dipole-dipole interactions between species. The films can be built by adsorption of species with alternating charge on a solid substrate such as glass, silicon, a polymer surface, or a previous polymer film disposed on a substrate, etc.

The high absorption coefficient can arise from the interaction of dipoles in a plane perpendicular to the probe direction. The process used to form these films can allow for strong dipole interactions within the adsorbed layer. Additionally, the process can allow for precise deposition of a single physical layer of the dipole-dipole-interacting absorbing species. As a result, the dipole-dipole interactions in the plane of absorbing species perpendicular to the probe direction can provide a high absorption constant in the thin film.

The high oscillator strength film can be an element of a critically coupled resonator (CCR). The CCR can include a reflective element (i.e., a structure capable of reflecting light of a desired wavelength, such as a mirror or dielectric Bragg reflector) optically coupled to the film. Optical coupling of the high oscillator strength film and the reflective element can give rise to critical coupling, in which greater than 90% of light having a critical wavelength is absorbed. The CCR can absorb greater than 90%, greater than 95%, or greater than 97% of the light at the critical wavelength. The critical coupling can be characterized by a very low reflectance at a critical wavelength, where the reflective element has a high reflectance in the absence of the critically coupled absorber. The CCR can include a top coat.

In one aspect, an optical device includes a light-absorbing film having a thickness and separated a distance apart from a reflective element. The light-absorbing film is critically coupled to the reflective element. The light-absorbing film can be critically coupled to the reflective element at a temperature above 77 Kelvin. The light-absorbing film can be critically-coupled at a wavelength between 250 nm and 2000 nm, such as between 250 nm and 400 nm, between 400 nm and 700 nm, between 700 nm and 900 nm n, between 900 nm and 1200 nm, or between 1200 nm and 2000 nm.

The light-absorbing film can be separated a distance apart from the reflective element by a light-transmitting material. The thickness of the light-absorbing film can be less than 80 nm, less than 50 nm, less than 25 nm, or less than 10 nm. The light-absorbing film can include a light-absorbing material. The light-absorbing film can include a multiply charged material. The light-absorbing material can include an organic compound or an inorganic compound. The light-absorbing material can include a J-aggregate, which can include a cyanine dye. The multiply charged material can include a polyelectrolyte. The light-absorbing film can include an electrostatic bilayer which includes a first layer including a polyelectrolyte and a second layer including a light-absorbing material. The optical device can be arranged on a substrate. The device can absorb at least 90% or at least 95% of light at a critical wavelength.

The reflective element can be a dielectric reflector including an insulator or semiconductor material or can include a metallic mirror. The reflective element can be a dielectric Bragg reflector, composed of insulator or semiconductor materials. The reflective element can include a semiconductor material. A dielectric reflector can derive its reflectivity from interference phenomena associated with the real part of the index of refraction of the reflecting elements. A very reflective mirror can be constructed from insulating or semiconducting materials because the reflectance is derived from a multitude of interference effects. A dielectric Bragg reflector refers specifically to a mirror where the thickness, $d_i$, of the different materials is chosen to satisfy the Bragg condition discussed in the text.

In another aspect, an optical device includes a light-absorbing film having a thickness of less than 80 nm and an extinction coefficient (κ) of at least 1 at a critical wavelength, and being separated a distance apart from a reflective element by a light-transmitting material, wherein the light-absorbing film is critically coupled to the reflective element. The light-absorbing film can have an extinction coefficient (K) of at least 2, at least 3, at least 4, or at least 5 at a critical wavelength.

In another aspect, a method of making an optical device includes arranging a light-absorbing film having a thickness a distance apart from a reflective element. The distance is selected to critically couple the light-absorbing film to the reflective element.

The method can include arranging the reflective element on a substrate. Arranging the reflective element on the substrate can include applying a metallic mirror to the substrate, or forming a dielectric reflector on the substrate. The method can include disposing a light-transmitting material adjacent to the reflective element. Disposing a light-transmitting material can include forming a desired thickness of the light-transmitting material.

Arranging the light-absorbing film a distance apart from the reflective element can include applying the light-absorbing film adjacent to the light-transmitting material. Arranging the light-absorbing film can include contacting a surface of the light-transmitting material with a multiply charged material. The multiply charged material can include a polyelectrolyte. Arranging the light-absorbing film can include contacting a surface of the light-transmitting material with a light-absorbing material.

In another aspect, a method of making an optical device includes forming a thickness of a light-transmitting material adjacent to a reflective element, and forming light-absorbing film having a thickness of less than 80 mm and an extinction coefficient ($\kappa$) of at least 1 at a critical wavelength adjacent to the thickness of the light-transmitting material. The light-absorbing film is critically coupled to the reflective element.

In another aspect, a device includes a light emitting layer configured light of a first wavelength, an absorber or emitter layer configured to receive the first wavelength emitted from the light emitting layer and transmit light of a second wavelength, and a dielectric reflector configured to receive the light of the second wavelength and transmit light out of the device. The light emitting layer can be patterned, the absorber or emitter layer can be patterned, or both.

In other aspects, a chemical sensor, a light harvesting device, or an optical switch can include a light-absorbing film having a thickness and separated a distance apart from a reflective element.

Other features, objects, and advantages will be apparent from the description and drawings, and from the claims.

DETAILED DESCRIPTION

Figure 1A:
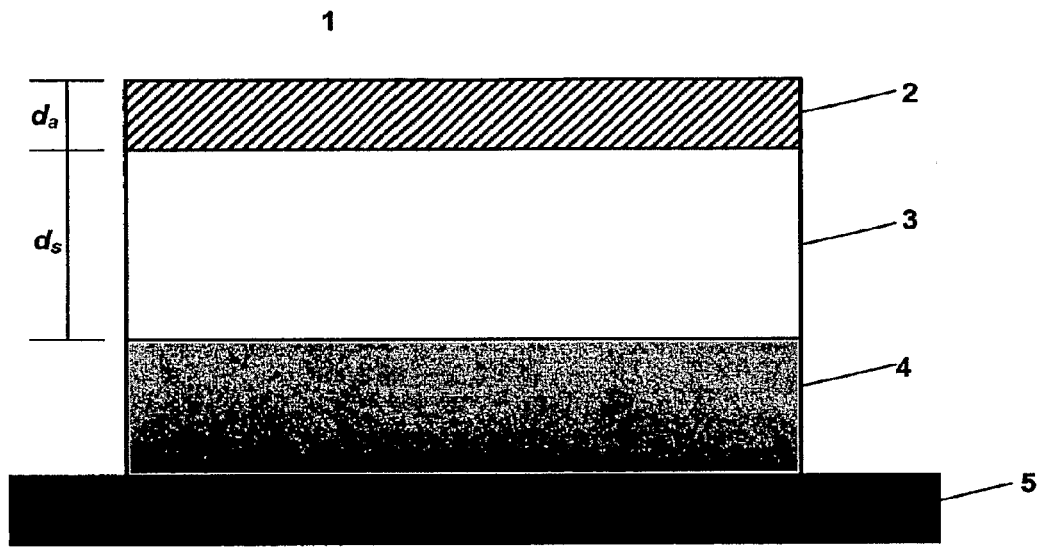
FIGS. 1A-1B are a schematic depictions of a critically coupled resonator.

Critical coupling occurs when (1) all of the incident optical power is transferred through the front face of the CCR absorber layer and (2) the Poynting vector in the dielectric layers is purely imaginary. Consequently, two boundary conditions must be simultaneously satisfied to achieve critical coupling: that is, the magnitude of the reflection coefficient from air to the absorber layer front face must be zero, and the magnitude of the reflection coefficient from the absorber layer back face to the dielectric spacer must be unity. The first condition is realized by impedance matching the CCR with air, and the second by mismatching the impedances across the absorber-spacer interface by a phase difference of $\pm p/2$. The second boundary condition also dictates that the Poynting vector is purely real on the absorber layer side of the interface.

Thin films having a high oscillator strength (i.e., absorption coefficient) can be made by alternately adsorbing two or more materials capable of non-covalent interaction onto a support or substrate from solution, where one material is a light absorbing material. The non-covalent interaction can be, for example, an electrostatic interaction or hydrogen bonding. Selection of appropriate materials and assembly conditions can result in a film where the light absorbing material participates in strong dipole-dipole interactions, favoring a high absorption coefficient. The light absorbing material can be a dye capable of forming a J-aggregate.

J-aggregates are crystallites of dye in which the transition dipoles of the constituent molecules strongly couple to form a collective narrow linewidth optical transition possessing oscillator strength derived from all the aggregated molecules. See, e.g., M. Vanburgel, et al., J. Chem. Phys. 102, 20 (1995), which is incorporated by reference in its entirety.

Layers of light absorbing material, which can be positively or negatively charged, can be interspersed with layers of an oppositely charged material. The oppositely charged material can include a multiply charged species. A multiply charged species can have a plurality of charge sites each bearing a partial, single, or multiple charge; or a single charge site bearing a multiple charge. A polyelectrolyte, for example, can have a plurality of charge sites each bearing a partial, single, or multiple charge. A polyelectrolyte has a backbone with a plurality of charged functional groups attached to the backbone. The charged functional groups attached to the backbone can be exclusively cationic (as in a polycation), exclusively anionic (as in a polyanion), or be a mixture of cationic groups and anionic groups. A copolymer of cationic and anionic monomers is an example of a polyelectrolyte having a mixture of cationic groups and anionic groups. Some polyelectrolytes, such as copolymers, can include both polycationic segments and polyanionic segments. The copolymer can be, for example, a block copolymer, a random copolymer, or other copolymer. A polycation has a backbone with a plurality of positively charged functional groups attached to the backbone, for example poly(allylamine hydrochloride) or poly(diallyldimethylammonium chloride). A polyanion has a backbone with a plurality of negatively charged functional groups attached to the backbone, such as sulfonated polystyrene (SPS), polyacrylic acid, or a salt thereof. Some polyelectrolytes can lose their charge (i.e., become electrically neutral) depending on conditions such as pH. The charge density of a polyelectrolyte in aqueous solution can be pH insensitive (i.e., a strong polyelectrolyte) or pH sensitive (i.e., a weak polyelectrolyte). Without limitation, some exemplary polyelectrolytes are poly diallyldimethylammonium chloride (PDAC, a strong polycation), poly allyl amine hydrochloride (PAH, a weak polycation), sulfonated polystyrene (SPS, a strong polyanion), and poly acrylic acid (PAA, a weak polyanion). Examples of a single charge site bearing a multiple charge include multiply charged metal ions, such as, without limitation, $Mg^{2+}$, $Ca^{2+}$, $Zn^{2+}$, $Fe^{2+}$, $Fe^{3+}$, $Co^{2+}$, $Cu^{2+}$, $Cd^{2+}$, $Sn^{4+}$, $Eu^{3+}$, $Tb^{3+}$, and the like. Multiply charged metal ions are available as salts, e.g. chloride salts such as $CoCl_2$, $FeCl_3$, $EuCl_3$, $TbCl_3$, $CdCl_2$, and $SnCl_4$.

The film can include hydrogen bonding polymers, such as, for example, polyacrylamide (PAm), polyvinylpyrolidone (PVP), and polyvinyl alcohol (PVA). The light absorbing film can include more than two materials. One of these materials is the light absorbing material and one of the other materials is either a multivalent ionic species or hydrogen bonding polymer. Additional materials may be included in the film to promote crosslinking, adhesion, or to sensitize light emission or absorption.

The thin films can include one or several layers of a polyelectrolyte and one or more charged species with strong dipole-dipole interactions and any additional dopants. At least one of the charged species used for strong dipole-dipole interactions has a charge opposite that of the polyelectrolyte used for the scaffold. When sequentially applied to a substrate, the oppositely charged materials attract one another forming an electrostatic bilayer. The polyelectrolyte provides a scaffold for the species with strong dipole-dipole interactions to form a layered structure. These films are compatible with other processes of building thin films through alternate adsorption of charged species. The films can be interspersed in a multifilm heterostructure with other thin films.

The charged species with strong dipole-dipole interactions can be a single type of species, such as a single type of J-aggregating material (for example, a cyanine dye). Alternatively, several charged species with strong dipole-dipole interactions among the species could be used. The species used for the strong dipole-dipole interacting layer can have individual dipoles that can couple together to produce a coherent quantum mechanical state. This allows for the buildup of coherence in two dimensions, producing effects in the probe dimension perpendicular to the interacting species.

J-aggregates of cyanine dyes have long been known for their strong fluorescence. This strong fluorescence makes J-aggregates a desirable candidate for use in organic light-emitting devices (OLEDs), and such devices have been produced. The layer-by-layer (LBL) technique for film growth, first developed by Decher et al., was extended to create thin films of J-aggregates, which have been used to create an OLED with J-aggregates as emitters. See, for example, E. E. Jelley, *Nature* 1936, 138, 1009; M. Era, C. Adachi, T. Tsutsui, S. Saito, *Chem. Phys. Lett.* 1991, 178, 488; G. Decher, J. D. Hong, J. Schmitt, *Thin Solid Films* 1992, 210, 831; H. Fukumoto, Y. Yonezawa, *Thin Solid Films* 1998, 329, 748; S. Bourbon, M. Y. Gao, S. Kirstein, *Synthetic Metals* 1999, 101, 152; Bradley, M. S. et al., *Advanced Materials* 2005, 17, 1881; and U.S. patent application Ser. No. 11/265,109, filed Nov. 3, 2005, each of which is incorporated by reference in its entirety. J-aggregates (and thin films including J-aggregates) can have a high oscillator strength at a characteristic wavelength. In other words, the J-aggregate strongly absorbs light of the characteristic wavelength. The characteristic wavelength depends primarily on the identity (i.e., the chemical structure) of the material forming the J-aggregate, and to a lesser degree on other factors, such as the chemical environment of the J-aggregate. For example, multilayer films of polycation and anionic J-aggregate dye contain a high density of J-aggregate and therefore have a high peak absorption coefficient of $\alpha=1.0\times10^6$ $cm^{-1}$. See M. S. Bradley, et al., Advanced Materials 17, 1881 (2005), which is incorporated by reference in its entirety. Because the film has a high absorption coefficient at its characteristic wavelength, a very thin film (e.g., less than 50 nm thick, less than 25 nm thick, less than 10 nm thick, or 5 nm thick or less) can absorb much of the light of the characteristic wavelength.

Layer-by-layer (LBL) processing of polyelectrolyte multilayers can produce conformal thin film coatings with molecular level control over film thickness and chemistry. Charged polyelectrolytes can be assembled in a layer-by-layer fashion. In other words, positively- and negatively-charged polyelectrolytes can be alternately deposited on a substrate. One method of depositing the polyelectrolytes is to contact the substrate with an aqueous solution of polyelectrolyte at an appropriate pH. The pH can be chosen such that the polyelectrolyte is partially or weakly charged.

A substrate subjected to sequential immersions in cationic and anionic solutions (i.e., solutions of polycation and polyanion), or SICAS, can produce a multilayer including a number of electrostatic bilayers on the substrate. An electrostatic bilayer is the structure formed by the ordered application of a multiply charged species (e.g., a polyelectrolyte or metal ion) and an oppositely charged material (e.g., a light absorbing material, polyelectrolyte or counterion). The properties of weakly charged polyelectrolytes can be precisely controlled by changes in pH. See, for example, G. Decher, Science 1997, 277, 1232; Mendelsohn et al., Langmuir 2000, 16, 5017; Fery et al., Langmuir 2001, 17, 3779; Shiratori et al., Macromolecules 2000, 33, 4213, each of which is incorporated by reference in its entirety.

The process conditions used in the deposition of the film can be varied. Some process conditions that can be varied include concentration, temperature, pH, salt concentration, co-solvent, co-solvent concentration, and deposition time. The temperature can be varied between, for example, 0° C. and 100° C., or between 5° C. and 80° C. The pH can be varied from 0.0 to 14.0, or from 3.0 to 13.0. The salt concentration can range from deionized (i.e., no salt added) to 1 M. NaCl and KCl are examples of salts used. Solutions can be prepared using water as the sole solvent, or with water and a co-solvent, such as an organic solvent. Some exemplary organic solvents include methanol, ethanol, isopropanol, acetone, acetic acid, THF, dioxane, DMF, and formamide. The deposition time can be 1 second or less; 30 seconds or less; 1 minute or less; 5 minutes or less; 10 minutes or less; 1 hour or less; or several hours or more. In some circumstances, deposition times will be in the range of 1 second to 10 minutes. Deposition of the film can include a post-treatment of the film. Post-treatment is any treatment applied to the film after the last bilayer is applied. The post-treatment can include a heat treatment, a pH treatment, a chemical modification, or other treatment. The post-treatment can be selected to alter a desired property of the film, such as its mechanical stability or porosity.

The density of the film can be modified by repeatedly immersing the substrate into solutions of the light absorbing material prepared with different process conditions. As an example, by cyclically immersing into a solution held at a temperature of 20° C. and then in a second solution held at 60° C., the crystallinity of the resultant film can be enhanced and dye density increased compared to films not treated in this manner.

The film can include a plurality of bilayers, such as fewer than 100, fewer than 50, fewer than 20, or fewer than 10 bilayers. The film can include 0.5, 1.0, 1.5, 2.0, 2.5, 3.0, 3.5, 4.0, 4.5, 5.0, 5.5, 6.0, 6.5, 7.0, 7.5, 8.0, 8.5, 9.0, 9.5, or 10.0 bilayers. In some embodiments, the film can include bilayers substantially free of light absorbing material, e.g., bilayers where one layer includes a polycation and the other layer includes a polyanion. Including bilayers that are substantially free of light absorbing material can be advantageous, for example, in altering the adhesion of the film to a substrate or in altering the thickness of the film.

The light absorbing film can be deposited on a hydrophilic or hydrophobic substrate. The film can be deposited onto conducting (e.g., metallic), semiconducting, or insulating layers (including glass and plastic); or bio-compatible materials, examples of which are a polymer film that is hydrophilic or hydrophobic, an oxide layer, a metal oxide layer, a metal layer, a DNA-coated surface, and others. Examples of a hydrophilic polymer layer include polyelectrolytes and hydrogen bonding polymers; amino acids; proteins; and hydrophilic polymers. Examples of hydrophobic polymers include PDMS, Poly-TPD, and MEH-PPV. Metal oxide layers include, for example alumina, titania, and zinc oxide. Examples of semiconducting layers are layers of Si, Ge, GaAs, GaN, AlGaAs, GaAsP, CdSe, CdS, ZnS, and metal halides, such as AgCl, AgBr, and AgI. Adhesion of the light absorbing film to the substrate can be promoted by varying the process conditions described above.

The light absorbing film can be optically coupled to a reflective element to form a resonator. The reflective element can be a layer of semiconductor deposited on a glass substrate. Alternatively, the substrate itself can be a semiconductor substrate, for example, silicon as, which is reflective at the wavelength of 1550 nm. A CCR can be contructed on top of a silicon substrate, possibly eliminating the need for additional mirror layers.

An exemplary resonator structure that optically couples the absorbing film to a reflective element is illustrated in FIG. 1A. In FIG. 1A, an absorbing film 2 is a high oscillator strength film, such as, for example, an electrostatic multilayer of a J-aggregate forming dye and a polyelectrolyte. The absorbing film 2 has a defined thickness, referred to as $d_a$. A surface of the absorbing film 2 is in optical communication with a light transmitting medium 1, e.g., air. Another surface of the absorbing film 2 is in optical communication with a reflective element 4 via an optically transmissive spacer layer 3. The spacer layer 3 has a defined thickness, $d_s$. The entire structure is arranged on a substrate 5.

The resonator of FIG. 1A can achieve critically coupled resonance when certain conditions are met. Critically coupled resonance results in near-complete absorption of light of a particular wavelength by the resonator. The CCR structure allows near-complete absorption even when the absorbing film is very thin (e.g., less than 50 nm, less than 25 nm, or less than 10 nm). The CCR structure absorbs light (of the critical wavelength) to a greater degree than the absorbing film does by itself (i.e., when the absorbing film is not optically coupled to a reflective element). The CCR can have an effective absorption coefficient at a critical wavelength of greater than $10^6$ cm$^{-1}$, greater than $2\times10^6$ cm$^{-1}$, greater than $3\times10^6$ cm$^{-1}$, greater than $4\times10^6$ cm$^{-1}$, greater than $5\times10^6$ cm$^{-1}$, or greater than $6\times10^6$ cm$^{-1}$. The absorption coefficient $\alpha$ can be related to the complex portion $\kappa$ of the complex index of refraction by the formula $\alpha=4\pi\kappa(\lambda)\lambda$, where $\lambda$ is the wavelength of light in centimeters. As such, the CCR can have an extinction coefficient $\kappa$ of at least 1, at least 2, at least 3, at least 4, or at least 5.

The optical properties of the resonator illustrated in FIG. 1A can be described mathematically. The mathematical description accounts for four regions of different refractive index: air (1), absorbing film (2), spacer (3), and reflective element (4). For simplicity in the mathematical description, reflective element 4 can be treated as a layer of silver mirror sufficiently thick to neglect reflections from the mirror/substrate interface. The mathematical description includes three interfaces between materials of different refractive index: interface 12, between air 1 and the absorbing film 2; interface 23, between absorbing film 2 and spacer 3; and interface 34, between spacer 3 and reflective element 4. The thickness of the absorber layer ($d_a$) is represented by $L_2$, and the thickness of the spacer is represented by $L_3$. For normal-incident light (i.e., light approaching the absorbing film at 90° to the surface of the film) of wavelength $\lambda$, the reflection coefficient r of the resonator is given by:

$$r = \frac{[r_{12}(1 + r_{23}r_{34}e^{2j\beta_3 L_3}) + e^{2j\beta_2 L_2}(r_{23} + r_{34}e^{2j\beta_3 L_3})]}{[(1 + r_{23}r_{34}e^{2j\beta_3 L_3}) + r_{12}e^{2j\beta_2 L_2}(r_{23} + r_{34}e^{2j\beta_3 L_3})]}$$

where the Fresnel coefficient $r_{ij}$ for interface ij is:

$$r_{ij} = \frac{(\tilde{n}_i - \tilde{n}_j)}{(\tilde{n}_i + \tilde{n}_j)}$$

and the wavevector $\beta_1$ for the $i^{th}$ layer is:

$$\beta_i = \frac{2\pi\tilde{n}_i}{\lambda}$$

where $\tilde{n}_i$ is the complex index of refraction for the $i^{th}$ layer.

The reflection coeffecient of the resonator is related to its percent reflectance (R) by $R=|r|^2$. Critical coupling occurs when the resonator parameters are selected such that R=0% at $\lambda_c$, since no light is transmitted through the CCR. In actual devices, R can approach 0% but be greater than 0%. For example the value of R at $\lambda_c$ can be 10% or less, 5% or less, or 2% or less. The reduction in reflectance is due to critical coupling, and not to an antireflective material. Although antireflective materials are known, the CCR can be substantially free of antireflective material. Critical coupling of the light absorbing film and reflective element can occur at a wide range of temperatures, such as 77 K or higher. The critical coupling can occur at any temperature from 77 K and higher until the temperature becomes so high that the material of the CCR begins to degrade. Critical coupling can occur, in the range of 250 K to 350 K, or 200 K to 400 K.

Figure 1B:
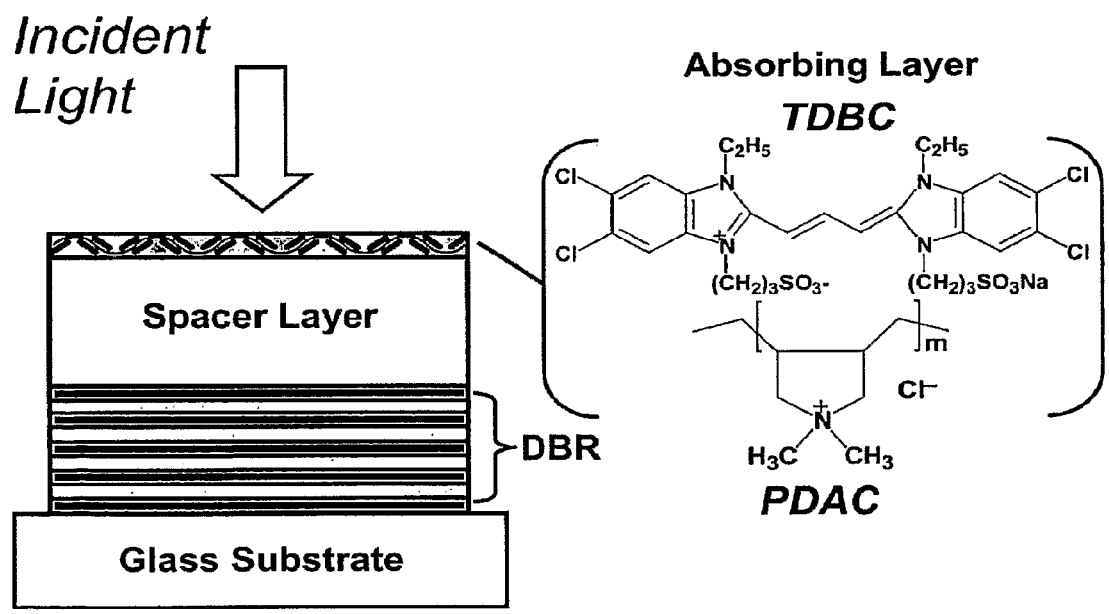

FIG. 1B illustrates a CCR in which the reflective element is a dielectric Bragg reflector (DBR). The DBR includes alternating layers of material having different refractive indices, where the thickness of each layer ($d_i$) is chosen to meet the Bragg condition, $d_i=\lambda/4n_i$, where $\lambda$ is wavelength and $n_i$ is the refractive index of material i. The DBR can be made by alternately sputtering two different materials of known refractive index to deposit alternating layers of a desired thickness on a substrate. The materials can be, for example, metal oxides such as a titanium oxide or an aluminum oxide. The materials can be, for example, metal oxides such as a titanium oxide, hafnium oxide, silicon dioxide, zirconium oxide or an aluminum oxide. Other materials that can be used in the DBR are conductive metal oxides such as indium tin oxide, tin oxide, zinc oxide or indium zinc oxide. The DBR can also be made of polymers and or chalcogenide materials. The layers can be deposited using any one or a combination of a variety of deposition techniques that include, for example, sputter coating, thermal evaporation, chemical vapor deposition, electron beam evaporation, spin casting, and extruding.

A top coat can be included with the CCR. The CCR can include a mirror element, spacer element, and absorber layer, where the mirror layer was deposited on a substrate followed by deposition of the spacer layer and absorber layer. In certain structures, these three elements can be integrated with other layers of materials. For instance, on top of the absorber layer a protective coating can be placed on top of a transparent material, such as an organic small molecule or polymer or metal-oxide like silica or alumina, and critical coupling can be achieved. Furthermore, a CCR can be constructed where the absorber layer can be deposited onto the substrate, followed by spacer and mirror layers.

An optical switch can include a CCR. When light is incident on the CCR from the absorber side of the device, almost none of the light is reflected, and is instead absorbed within the absorber layer. However, the absorptive tendencies of the absorber layer can be momentarily switched off. During this brief moment, in which the absorber layer is temporarily bleached, the CCR reflects the light incident on it from the absorber layer side of the device. It is possible that briefly the mirror layer can reflect light as efficiently as if the absorber was physically not present. The temporary bleaching of the absorber layer can be accomplished by optically exciting the absorber layer with a high power burst of light energy. The burst of light energy can be delivered at the critical wavelength at which the CCR can act or at another wavelength at which the absorber layer can absorb light. In the case of J-aggregates of cyanine dyes, the extremely large absorption non-linear response coefficient ($\chi^{(3)}$) at the J-aggregate resonance due to the cooperative coupling amongst the individual dye molecules can enable optical switching to be achieved with very low energy, arguably less energy than is required to switch state-of-the-art silicon transistors. The switching recovery time can occur within less than 20 ps, for example, within 3 ps, which can result in a fast all-optical room-temperature optical switch architecture which can find use in short haul optical interconnects on silicon microchips.

A light harvesting device can include a CCR. The CCR structure can include mirror element, spacer and absorber layer with electrical contacts in order to extract photovoltaic energy from the light absorbed within the absorber layer. The electrical contacts can be placed on top of the absorber layer, underneath it, or on the sides adjacent to it. The metallic mirror layer can act as one of these contacts. A protective layer deposited on top of the absorber layer, if made of an electrical conductive material, can also be one of the electrical contacts. For example, the contact can include indium tin oxide.

A chemical sensor can include a CCR. There are at least two methods in which the CCR can be utilized for chemical sensing applications. The first method can be a reflectance/absorbance based sensor. The second method is a fluorescence based sensor. In the first method, a component that is chemically sensitive to the chemical to be sensed can be incorporated into the absorber layer element of the CCR. When the chemical is present, this component can alter the absorber layer's ability to respond to light at the CCR critical wavelength. The reflectance of the CCR can thus be modulated from nearly 0% (chemical absent) to nearly 100% (chemical present). If the absorber layer material itself is sensitive to this chemical, then adding a compounds to the absorber layer would not be necessary although it could still enhance sensitivity. In the second method, the absorber layer can absorb nearly all of the light incident at the critical wavelength. This absorbed light energy would actually be emitted as fluorescence from the absorber material itself or from another component incorporated in the layer to accept the absorbed energy and radiate it. However, in the presence of the chemical to be sensed, one of these fluorescent pathways can be quenched. Thus the presence or absence of fluorescence would be indicative of the absence or presence of the chemical in the environment. Another component can be incorporated with the absorber layer that is sensitive to the chemical to be sensed.

EXAMPLES

In the CCR of FIG. 1B, the absorbing layer was a thin film consisting of layers of the cationic polyelectrolyte PDAC Holy diallyldimethylammonium chloride) and J-aggregates of the anionic cyanine dye TDBC (5,6-dichloro-2-[3-[5,6-dichloro-1-ethyl-3-(3-sulfopropyl)-2(3H)-benzimidazolidene]-1-propenyl]-1-ethyl-3-(3-sulfopropyl) benzimidazolium hydroxide, inner salt, sodium salt). Molecular structures of PDAC and TDBC are shown in FIG. 1B. The DBR was 8.5 pairs of sputter-coated $TiO_2$ and $Al_2O_3$ layers, ending on $TiO_2$. The spacer layer was an additional sputter-coated layer of $Al_2O_3$. The J-aggregate layer was prepared by depositing PDAC and TDBC by sequential immersion into cationic and anionic aqueous solutions (pH=5.5) utilizing the technique described in M. S. Bradley, et al., Advanced Materials 17, 1881 (2005), which is incorporated by reference in its entirety. Reflection and transmission measurements were made with light incident from the J-aggregate side of the device.

The critically coupled resonator (CCR) structure can include a dielectric Bragg reflector (DBR), a transparent spacer layer, and a layer of J-aggregate cyanine dye. The DBR can include 8.5 pairs of sputter coated $TiO_2$ and $Al_2O_3$ layers, ending on $TiO_2$. The spacer layer can be an additional sputter coated layer of $Al_2O_3$. The J-aggregate layer can include of the cationic polyelectrolyte, PDAC, and the anionic cyanine dye, TDBC, deposited via sequential immersion into cationic and anionic aqueous solutions (pH=5.5) utilizing a previously described technique (see, M. S. Bradley, J. R. Tischler, V. Bulovic, Adv. Mater. 2005, 17, 1881, which is incorporated by reference in its entirety).

When constructing a system for demonstrating strong coupling, the natural tendency is to focus primarily on the optical properties of the components, i.e. the excitonic layer and the microcavity, and on the fully integrated composite system to check for Rabi-splitting. Understandably, optical measurements of the half cavity structure consisting of just one of the two mirrors from the microcavity and the excitonic layer are routinely not reported.

Figure 2:
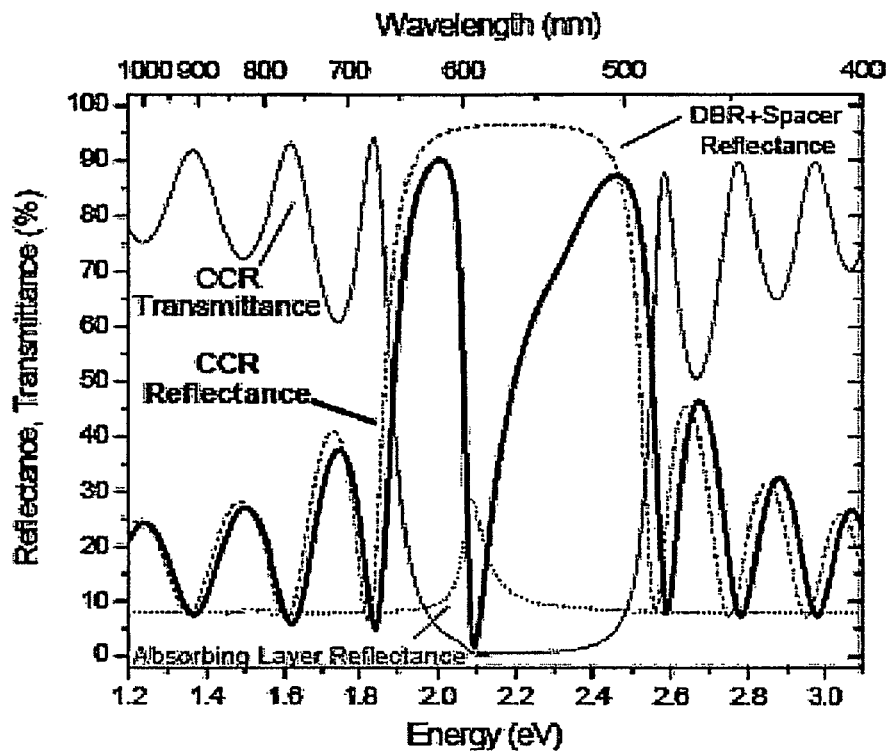
FIG. 2 is a graph depicting results of optical measurements on components of a critically coupled resonator and of an assembled critically coupled resonator.

FIG. 2 presents reflectance and transmittance data for the CCR, along with reflectance data for the neat PDAC/TDBC film and for the dielectric stack of DBR with spacer layer without an absorbing film applied. The vertical axis in FIG. 2 runs from 0.0 to 1.0, which corresponds to 0% to 100% in reflectance and transmittance. When light of wavelength $\lambda$=591 nm was incident on the CCR of FIG. 1B from the absorbing layer side of the device, the measured reflectance was R=2% (FIG. 2). In contrast, for the DBR with spacer but without the absorbing layer, the reflectivity at $\lambda_c$=591 nm exceeded 95%, showing the dramatic change in reflectance due to critical coupling. For the same CCR, the transmittance at $\lambda_c$ is T=1%. Consequently, 97% of the incident light was absorbed within the 5.1±0.5 nm thick absorber layer, yielding a maximum effective absorption coefficient of $\alpha_{eff}$=6.9×10$^6$ cm$^{-1}$.

Figure 3:
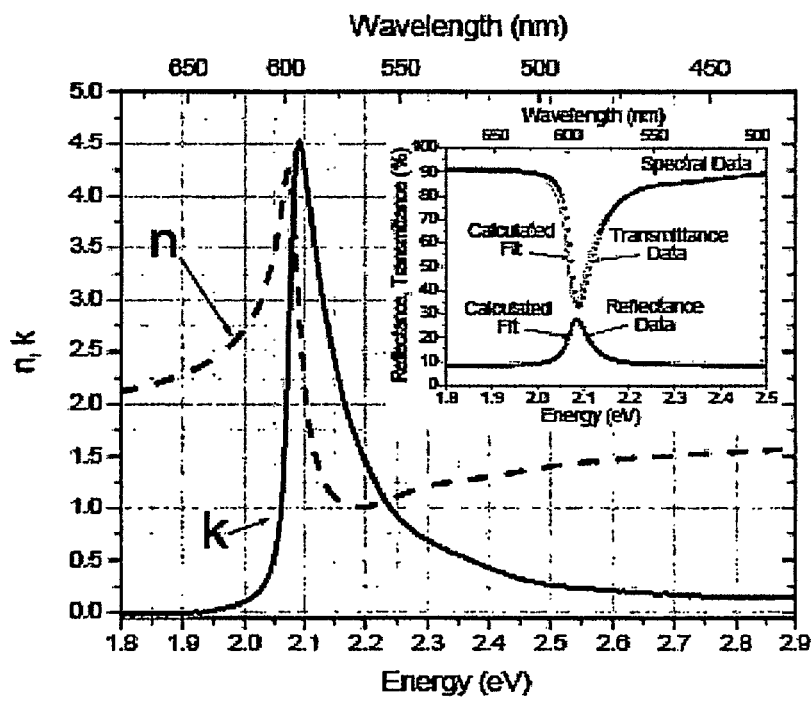
FIG. 3 is a graph depicting calculated optical properties of a light absorbing film.

A wavelength resolved T-matrix simulation (FIGS. 3 and 4) numerically confirmed the critical coupling phenomenon. To simulate the CCR's reflectance, T-matrices corresponding to the PDAC/TDBC film and the DBR were constructed. The film was modeled following the procedure described in M. S. Bradley, et al., Advanced Materials 17, 1881 (2005), wherein (n,κ) are obtained through a Kramers-Kronig regression based on reflectance data of the neat film deposited on a $SiO_2$ substrate (FIG. 3). FIG. 3 displays spectrally resolved real and imaginary components of the refractive index, $(n,\kappa)$, for 5.1±0.5 nm thick PDAC/TDBC film deposited on an $SiO_2$ substrate.

Figure 4:
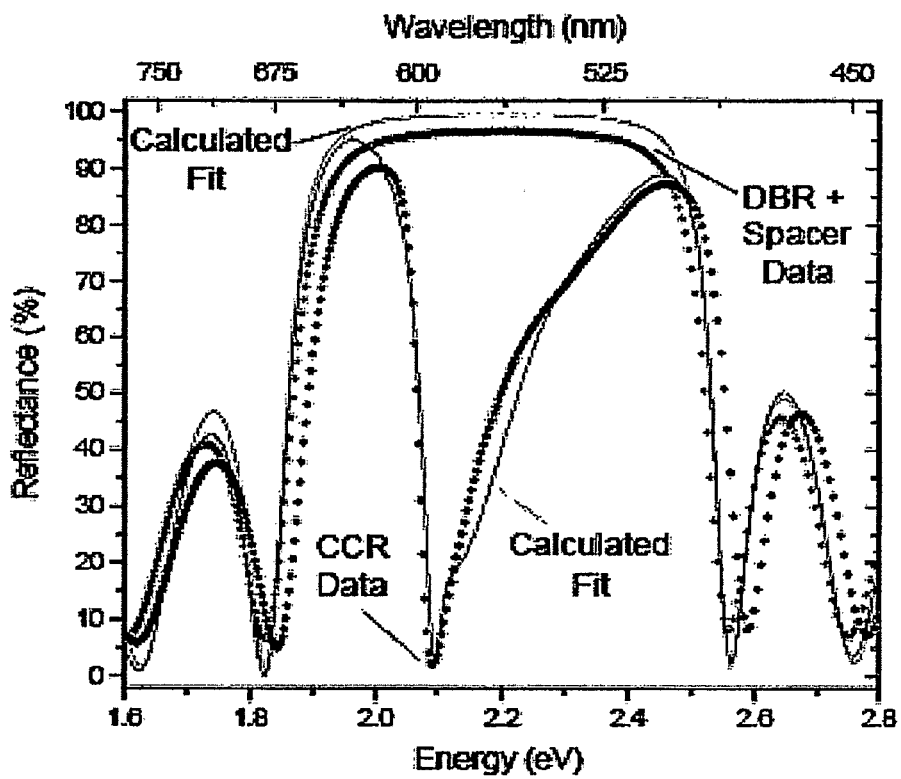
FIG. 4 is a graph compared measured and calculated optical properties of optical devices.

In modeling the CCR, the DBR was modeled as 8.5 pairs of $TiO_2$ and $Al_2O_3$ layers, with refractive indices of $n=2.39$ and $n=1.62$ respectively, with layer thickness adjusted to satisfy the Bragg condition ($d_i=\lambda/4n_i$) for $\lambda=565$ nm, to reflect the results of the experiment. The maximum value of $\kappa$ occurred at $\lambda=593$ nm, while the peak reflectance of the thin film occurs at $\lambda=595$ nm. These models were combined with a model of the spacer layer with $n_s=1.62$ and thickness, $d_s$, left as a free parameter. The simulation reproduced critical coupling at $\lambda_c=591$ nm (FIG. 4) for a spacer layer thickness $d_s=90$ nm and odd multiples thereof. FIG. 4 compares measured and calculated reflectance for the CCR device and DBR spacer stack. The calculated reflectance was based on the T-matrix formalism. The calculated fit matched the experimentally observed reflectance minimum at $\lambda c=591$ nm.

When $d_s$ was set to a value greater or less than 90 nm, critical coupling did not occur at another wavelength, because once the absorber layer thickness, $d_a$, was set, critical coupling can occur only at one specific wavelength, $\lambda_c$. The simulation also predicted that critical coupling was achieved at $\lambda_c=591$ nm with an Ag mirror replacing the DBR, and $d_s=90$ nm was still the critical thickness. With a non-ideal metallic mirror (e.g. Ag), not all of the light absorption was predicted to occur in the absorber layer, as would be the case with an ideal metal mirror ($\kappa\to\infty$), but the reflectance from top surface of the CCR was still predicted to be zero, as a result of critical coupling.

The critical coupling phenomenon observed for the 5.1 nm thick film of PDAC/TDBC spaced 90 nm from the DBR of FIG. 1B is not limited to these particular materials and thicknesses. Critical coupling can be achieved with any thin film absorber layer of sufficient oscillator strength (i.e., K), providing that $d_a$ and $d_s$ are set to the appropriate thicknesses. To demonstrate this, a generalized formalism of critical coupling for the CCR structure of FIG. 1B was constructed. As described above, critical coupling occurs when the resonator parameters are selected such that $R=|r|^2=0\%$, where $$r = \frac{[r_{12}(1+r_{23}r_{34}e^{2j\beta_3 L_3}) + e^{2j\beta_2 L_2}(r_{23}+r_{34}e^{2j\beta_3 L_3})]}{[(1+r_{23}r_{34}e^{2j\beta_3 L_3}) + r_{12}e^{2j\beta_2 L_2}(r_{23}+r_{34}e^{2j\beta_3 L_3})]}$$

where the Fresnel coefficient $r_{ij}$ for interface ij is:

$$r_{ij} = \frac{(\tilde{n}_i - \tilde{n}_j)}{(\tilde{n}_i + \tilde{n}_j)}$$

and the wavevector $\beta_i$ for the $i^{th}$ layer is:

$$\beta_i = \frac{2\pi\tilde{n}_i}{\lambda}$$

Figure 5:
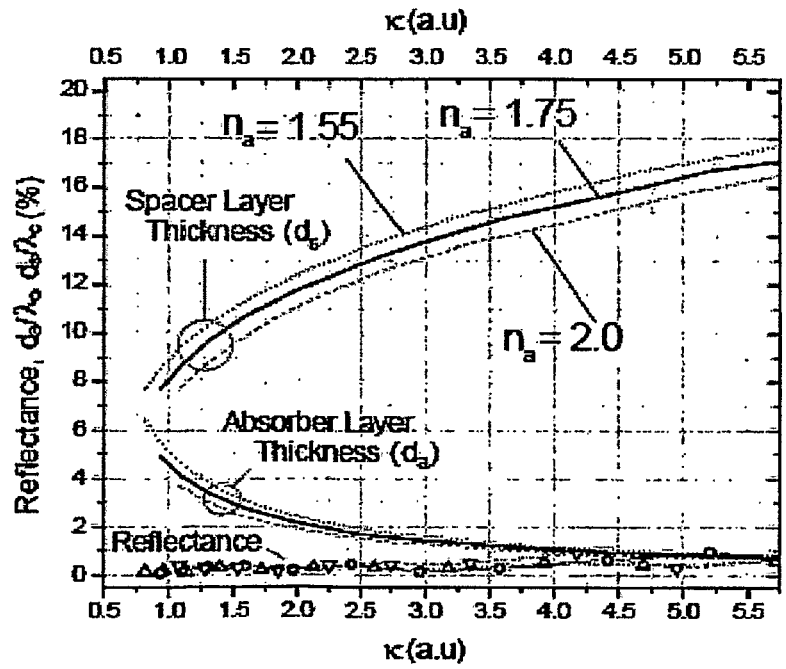
FIG. 5 is a graph depicting calculated optical properties of a critically coupled resonator.

FIG. 5 illustrates the generalized formalism for critically coupling absorber layer of FIG. 1B as a function of absorber $\kappa$. Thicknesses for absorber and spacer layers were normalized to the CCR wavelength, $\lambda_c$. The reflectance plotted was at $\lambda_c$. FIG. 5 shows the absorber and spacer layer thicknesses required to achieve critical coupling as a function of the absorber layer oscillator strength K. The result was plotted for three different values of the real part of the absorber layer refractive index, $n_a\in(1.55, 1.75, 2.0.)$, $n_s=1.7$ throughout, and the single mirror layer was assumed to be Ag, with complex refractive index $\tilde{n}=0.259+j3.887$ at $\lambda=591$ nm (this value of $\tilde{n}$ was derived from a fit of published $\tilde{n}$ values, see H. J. Hagemann, et al., *J. Opt. Soc. Am.* 65, 742 (1975), which is incorporated by reference in its entirety). The thicknesses are normalized to $\lambda_c$ to emphasize the generality of this model. The model showed that to satisfy CCR conditions as $\kappa$ increases, the absorber layer thickness must decrease, with a corresponding increase in the spacer layer thickness. The model also showed that for a given $\kappa$, as $n_a$ increases, $d_s$ decreases, as expected, while $d_a$ stayed relatively constant. The model dictates that in order to critically couple the $d_a=5.1$ nm thick PDAC/TDBC film of FIG. 1 at $\lambda_c=584$ nm ($d_a/\lambda_c=0.87\%$) the extinction coefficient of the film must be $\kappa=4.2$, which also sets $d_s/\lambda_c=15\%$ or equivalently $d_s=88$ nm for $n_a=2.0$ and $n_s=1.7$. These theoretical values agree well with the experimentally measured $\kappa=4.2$ and $n_a=2.1$ at 591 nm (from FIG. 3) and $d_s=90$ nm for the CCR structure in FIG. 2 with $n_s=1.62$ For the 5.1 nm thick film of PDAC/TDBC, the results in FIG. 5 were in close agreement with the experimental results and with the full simulation for the CCR structure (FIG. 4). For wavelengths in the range around $\lambda_c=584$ nm and for $d_a=5.1$ nm, $d_a/\lambda_c=0.0087$, which dictates that $\kappa=4.2$. From the dispersion relation of FIG. 3, the value of $\kappa=4.2$ corresponds to $n_a=2.1$ and the observed spacer layer thickness is $d_s=90\pm1$ nm. Consistent with these observations, for $n_a=2.0$, FIG. 5 sets $ds/\lambda c=0.147$, or equivalently $d_s=90.3$ nm for $\lambda_c=584$ nm.

Table 1 presents calculated critical thicknesses of absorber and spacer layers for critically coupling a thin film with absorption coefficient $\alpha=4.0\times10^5$ cm$^{-1}$. Real component of absorber layer refractive index $n=1.75$. Average reflectance values were 0.3±0.1%. The critical thickness in absolute terms was relatively constant across wavelengths for fixed $\alpha$.

TABLE 1

| Wavelength $\lambda_c$ (nm) | $\kappa$ | $d_a$ (nm) | $d_a$ (%) | $d_s$ (nm) | $d_s$ (%) |
|---|---|---|---|---|---|
| 350 | 1.11 | 12.4 | 3.5 | 27.6 | 7.9 |
| 410 | 1.31 | 12.1 | 3.0 | 36.4 | 8.9 |
| 450 | 1.43 | 12.2 | 2.7 | 42.1 | 9.4 |
| 525 | 1.67 | 12.1 | 2.3 | 53.2 | 10.1 |
| 600 | 1.91 | 12.0 | 2.0 | 65.0 | 10.8 |
| 700 | 2.15 | 12.0 | 1.8 | 77.4 | 11.5 |

Table 2 presents calculated critical thicknesses of absorber and spacer layers for critically coupling a thin film of absorption coefficient K to either of two wavelengths. The real component of absorber layer refractive index was $n=1.75$. Average reflectance value was 0.6±0.3%, and the same reflectance was produced at both critical wavelengths.

TABLE 2

| Wavelength $\lambda_c$ (nm) | $\kappa$ | $d_a$ (%) | $d_a$ (nm) | $d_s$ (%) | $d_s$ (nm) |
|---|---|---|---|---|---|
| 410 | 0.93 | 5.0 | 20.4 | 7.6 | 31.2 |
| 584 | 0.93 | 5.0 | 29.1 | 7.6 | 44.4 |
| 410 | 2.79 | 1.5 | 6.3 | 13.5 | 55.2 |
| 584 | 2.79 | 1.5 | 9.0 | 13.5 | 78.7 |
| 410 | 4.65 | 0.9 | 3.6 | 16.0 | 65.6 |
| 584 | 4.65 | 0.9 | 5.2 | 16.0 | 93.5 |

If the thin films that produce critical coupling in the CCR were deposited as neat films on glass (n=1.48), T-matrix simulation showed that they would absorb, on average, 32% of incident light at $\kappa_c$. The absorption increase due to the critical coupling was therefore a factor of 3.1. Similarly, if such an absorber layer were inserted into a symmetric λ/2 microcavity, the maximum absorption would be 50% (with T=25% and R=25%). Thus, the CCR structure was not only convenient (i.e., easier to make than a symmetric microcavity), it was also essential for maximizing light absorption. This suggests several practical device implementations. For example, the CCR structure can be used in optically stimulated chemical sensors where a thin luminescent chemosensitive film is deposited on top of the CCR structure and excited by energy transfer from the CCR absorber layer. See, for example, A. Rose, et al., Nature 434, 876 (2005), which is incorporated by reference in its entirety. Compared to existing structures, a factor of 6 reduction in pump power is expected, since the chemosensitive films would effectively absorb 3.2 times more light, and the back mirror would direct twice the photoluminescence into the detector. Application of the CCR phenomenon can also facilitate development of single photon optics where it is desirable to absorb a photon with 100% probability in the thinnest possible films.

When a thin film of PDAC/TDBC is placed at the antinode of the optical field of a microcavity resonantly tuned to the excitonic absorption peak, strong coupling was observed. See J. R. Tischler, et al., Phys. Rev. Lett. 95, 036401 (2005), which is incorporated by reference in its entirety. New polaritonic resonances appeared in the linear optical measurements of the composite structure corresponding to the superposition states of the strongly coupled light/matter system. Strong coupling was achieved even in low Q all metal microcavities, with Rabi splitting of 265 meV, due to the high absorption coefficient of the PDAC/TDBC films and their relatively narrow reflectance linewidth, FWHM=67 meV. The polaritonic band gap observed in these full microcavity structures was manifested as a high reflectance at the uncoupled excitonic resonance. The appearance of a polaritonic band gap follows naturally from the realization that the strongly coupled exciton-polariton device is a CCR plus a "top" DBR, separated approximately λ/4n away from the CCR absorbing layer, where n is the refractive index of the transparent spacer layer. With the CCR in place, when the "top" DBR is added to complete the microcavity, there is no optical feedback to cause a resonant dip in reflectance and therefore the high reflectance of the "top" DBR is observed as the polariton bandgap.

As alternatives to PDAC/TDBC and other J aggregates, CCR's can also be constructed with a variety of highly absorptive materials. Among non-epitaxially grown materials, CCR structures could be implemented with organic polymers that are used in biological assays and chemical sensors, with molecular materials that are used in photodetectors and xerographic photoresistors, and in the emerging uses of colloidally grown inorganic nanocrystal quantum dots (QDs), with the QD continuum states providing the necessary absorption. See, for example, C. A. Leatherdale, W.-K. Woo, F. V. Mikulec, M. G. Bawendi, *J. Phys. Chem. B* 106, 7619 (2002), which is incorporated by reference in its entirety. A CCR can be used, for example, in chemical sensors, nanoscale thin-film photodetectors, or "Exciton-Polaritons" materials satisfying CCR criteria.

Figure 6A:
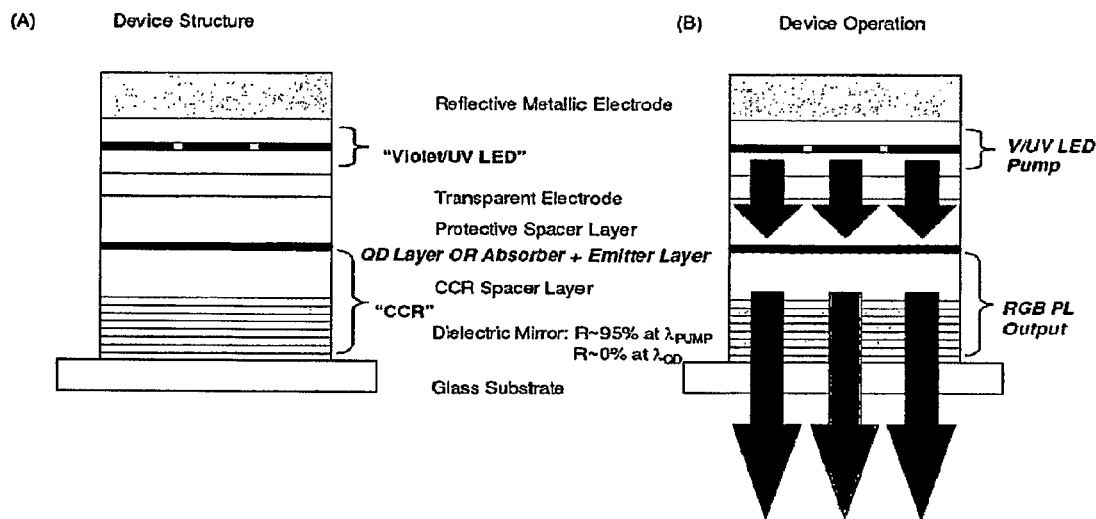
FIGS. 6A-6C are schematic diagrams depicting a device including a critically coupled resonator.
Figure 6B:
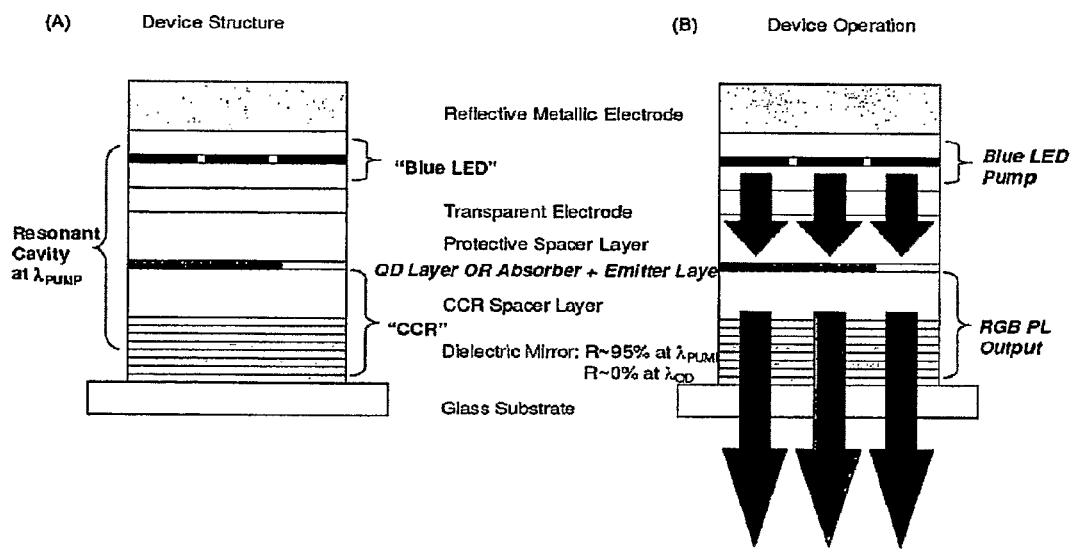
Figure 6C:
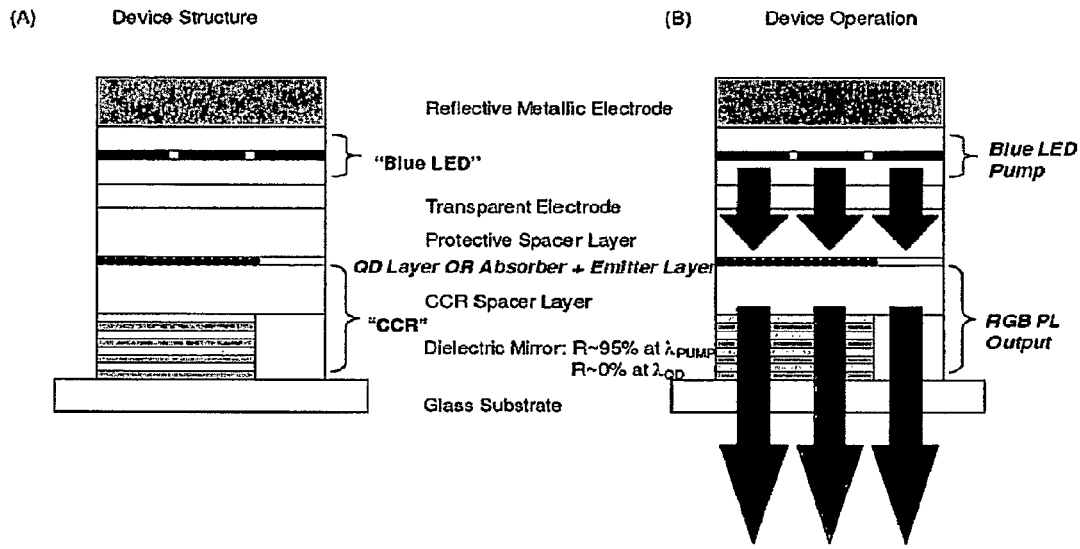

Referring to FIGS. 6A-6C, a device including a critically coupled resonator can include a blue- or ultraviolet-light emitting structure, the light from which interacts with an absorber or emitter layer which in turn transmits light at a plurality of selected wavelengths through a critically coupled resonator. Any combination of the absorber or emitter layer or the DBR layer can be patterned.

Figure 7:
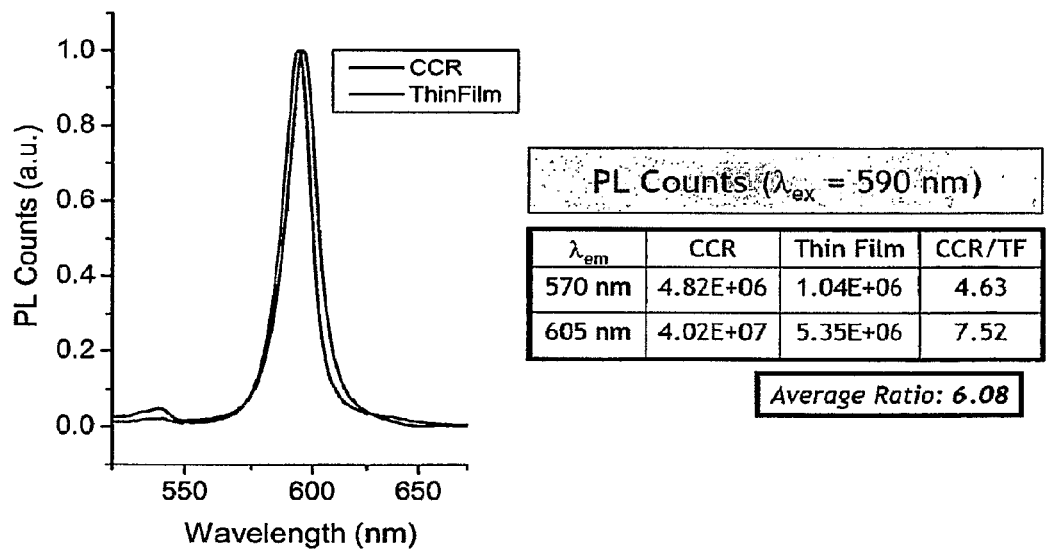
FIG. 7 is a schematic depicting increase of photoluminescence using a critically coupled resonator.

Photoluminescence can be increased by a factor of about 6 when a critically coupled resonator structure is optically excited near $\lambda_c$. A factor of 3 increase can be attributed to the critically coupled resonator film, which absorbs 32% when on glass and nearly 100% on DBR, and a factor of 2 collection efficiency can be attributed to a collection efficiency boost due to a back DBR reflector. Using this type of structure, a sensor can be developed that can be optically pumped with $\frac{1}{6}^{th}$ power. See FIG. 7.

Other embodiments are within the scope of the following claims.

What is claimed is:

1. An optical device comprising a light-absorbing film having a thickness and being separated a distance apart from a reflective element, wherein the light-absorbing film is critically coupled to the reflective element, wherein the light-absorbing film includes a light-absorbing material, and wherein the light absorbing film includes a multiply charged material.

2. The optical device of claim 1, wherein the light-absorbing film is critically coupled to the reflective element at a temperature above 77 Kelvin.

3. The film of claim 1, wherein the film is critically-coupled at a wavelength between 250 nm and 2000 nm.

4. The film of claim 1, wherein the film is critically-coupled at a wavelength between 250 nm and 400 nm.

5. The film of claim 1, wherein the film is critically-coupled at a wavelength between 400 nm and 700 nm.

6. The film of claim 1, wherein the film is critically-coupled at a wavelength between 700 nm and 900 nm.

7. The film of claim 1, wherein the film is critically-coupled at a wavelength between 900 nm and 1200 nm.

8. The film of claim 1, wherein the film is critically-coupled at a wavelength between 1200 nm and 2000 nm.

9. The optical device of claim 1, wherein the light-absorbing film is separated a distance apart from the reflective element by a light-transmitting material.

10. The optical device of claim 1, wherein the light-absorbing film has a thickness of less than 80 nm.

11. The optical device of claim 1, wherein the light-absorbing film has a thickness of less than 50 nm.

12. The optical device of claim 1, wherein the light-absorbing film has a thickness of less than 25 nm.

13. The optical device of claim 1, wherein the light-absorbing film has a thickness of less than 10 nm.

14. The optical device of claim 1, wherein the light-absorbing material includes an organic compound.

15. The optical device of claim 1, wherein the light-absorbing material includes an inorganic compound.

16. The optical device of claim 1, wherein the light-absorbing material includes a J-aggregate.

17. The optical device of claim 16, wherein the J-aggregate includes a cyanine dye.

18. The optical device of claim 1, wherein the multiply charged material includes a polyelectrolyte.

19. The optical device of claim 1, wherein the light-absorbing film includes an electrostatic bilayer, the electrostatic bilayer including a first layer including a polyelectrolyte and a second layer including a light-absorbing material.

20. The optical device of claim 1, wherein the reflective element is a dielectric reflector including an insulator or semiconductor material.

21. The optical device of claim 1, wherein the reflective element includes a metallic mirror.

22. The optical device of claim 1, wherein the reflective element is a dielectric Bragg reflector, composed of insulator or semiconductor materials.

23. The optical device of claim 1, wherein the reflective element includes a semiconductor material.

24. The optical device of claim 1, wherein the optical device is arranged on a substrate.

25. The optical device of claim 1, wherein the device absorbs at least 90% of light at a critical wavelength.

26. The optical device of claim 1, wherein the device absorbs at least 95% of light at a critical wavelength.

27. A chemical sensor including a device of claim 1.

28. A light harvesting device including a device of claim 1.

29. An optical switch including a device of claim 1.

30. The optical device of claim 1, wherein the light-absorbing film is critically coupled to the reflective element when all of an incident optical power is transferred through a front face of a light-absorbing layer and a Poynting vector in the light-absorbing film is imaginary.

31. An optical device comprising a light-absorbing film having a thickness of less than 80 nm and an extinction coefficient ($\kappa$) of at least 1 at a critical wavelength, and being separated a distance apart from a reflective element by a light-transmitting material, wherein the light-absorbing film is critically coupled to the reflective element.

32. The optical device of claim 31, wherein the light-absorbing film has an extinction coefficient ($\kappa$) of at least 2 at a critical wavelength.

33. The optical device of claim 31, wherein the light-absorbing film has an extinction coefficient ($\kappa$) of at least 3 at a critical wavelength.

34. The optical device of claim 31, wherein the light-absorbing film has an extinction coefficient ($\kappa$) of at least 4 at a critical wavelength.

35. The optical device of claim 31, wherein the light-absorbing film has an extinction coefficient ($\kappa$) of at least 5 at a critical wavelength.

36. A method of making an optical device comprising arranging a light-absorbing film having a thickness a distance apart from a reflective element, wherein the distance is selected to critically couple the light-absorbing film to the reflective element, wherein arranging the light-absorbing film a distance apart from the reflective element includes applying the light-absorbing film adjacent to a light-transmitting material and contacting a surface of the light-transmitting material with a multiply charged material.

37. The method of claim 36, further comprising arranging the reflective element on a substrate.

38. The method of claim 37, wherein arranging the reflective element on the substrate includes applying a metallic mirror to the substrate.

39. The method of claim 37, wherein arranging the reflective element on the substrate includes forming a dielectric Bragg reflector on the substrate.

40. The method of claim 36, further comprising disposing a light-transmitting material adjacent to the reflective element.

41. The method of claim 40, wherein disposing a light-transmitting material includes forming a desired thickness of the light-transmitting material.

42. The method of claim 36, wherein the multiply charged material includes a polyelectrolyte.

43. The method of claim 36, wherein the light-absorbing material includes a J-aggregate.

44. The method of claim 43, wherein the J-aggregate includes a cyanine dye.

45. The method of claim 36, wherein the light-absorbing film has a thickness of less than 80 nm.

46. The method of claim 36, wherein the light-absorbing film has a thickness of less than 50 nm.

47. The method of claim 36, wherein the light-absorbing film has a thickness of less than 25 nm.

48. The method of claim 36, wherein the light-absorbing film has a thickness of less than 10 nm.

49. A method of making an optical device comprising:
forming a thickness of a light-transmitting material adjacent to a reflective element; and
forming light-absorbing film having a thickness of less than 80 nm and an extinction coefficient ($\kappa$) of at least 1 at a critical wavelength adjacent to the thickness of the light-transmitting material, wherein the light-absorbing film is critically coupled to the reflective element.

* * * * *